United States Patent
Whitehead et al.

(10) Patent No.: US 9,520,860 B2
(45) Date of Patent: Dec. 13, 2016

(54) TIME DISTRIBUTION SWITCH

(71) Applicant: Schweitzer Engineering Laboratories, Inc., Pullman, WA (US)

(72) Inventors: David E. Whitehead, Pullman, WA (US); Shankar V. Achanta, Pullman, WA (US); Henry Loehner, Spokane Valley, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 582 days.

(21) Appl. No.: 14/057,803

(22) Filed: Oct. 18, 2013

(65) Prior Publication Data
US 2014/0111249 A1   Apr. 24, 2014

Related U.S. Application Data

(60) Provisional application No. 61/716,310, filed on Oct. 19, 2012.

(51) Int. Cl.
| | |
|---|---|
| *G01S 19/20* | (2010.01) |
| *G01S 19/34* | (2010.01) |
| *H03K 3/01* | (2006.01) |
| *G06F 1/14* | (2006.01) |
| *G01S 19/00* | (2010.01) |
| *H04J 3/06* | (2006.01) |

(Continued)

(52) U.S. Cl.
CPC ........ *H03K 3/01* (2013.01); *G06F 1/14* (2013.01); *H04J 3/0688* (2013.01); *G01S 19/00* (2013.01); *H02H 7/261* (2013.01); *H02H 7/28* (2013.01); *H04J 3/0644* (2013.01)

(58) Field of Classification Search
USPC ..... 342/357.58, 357.63, 357.74, 374; 327/99
See application file for complete search history.

(56) References Cited

U.S. PATENT DOCUMENTS

| | | | |
|---|---|---|---|
| 5,160,926 | A | 11/1992 | Schweitzer |
| 5,537,143 | A | 7/1996 | Steingold |
| 5,557,284 | A | 9/1996 | Hartman |

(Continued)

FOREIGN PATENT DOCUMENTS

| | | |
|---|---|---|
| WO | 9747987 | 12/1997 |
| WO | 0016525 | 3/2000 |

(Continued)

OTHER PUBLICATIONS

PCT/US2013/064942 Patent Cooperation Treaty, International Search Report and Written Opinion of the International Searching Authority, Jan. 29, 2014.

(Continued)

*Primary Examiner* — Dao Phan
(74) *Attorney, Agent, or Firm* — Stoel Rives, LLP; Richard M. Edge

(57) ABSTRACT

Systems and methods for detecting the failure of a precision time source using an independent time source are disclosed. Additionally, detecting the failure of a GNSS based precision time source based on a calculated location of a GNSS receiver is disclosed. Moreover, the system may be further configured to distribute a time derived from the precision time source as a precision time reference to time dependent devices. In the event of a failure of the precision time source, the system may be configured to distribute a time derived from a second precision time source as the precision time signal during a holdover period.

20 Claims, 8 Drawing Sheets

(51) Int. Cl.
  *H02H 7/26* (2006.01)
  *H02H 7/28* (2006.01)

(56) References Cited

U.S. PATENT DOCUMENTS

| | | |
|---|---|---|
| 5,737,715 A | 4/1998 | Deaton |
| 5,995,911 A | 11/1999 | Hart |
| 6,061,573 A | 5/2000 | Goldberg |
| 6,144,334 A | 11/2000 | Claffey |
| 6,229,479 B1 | 5/2001 | Kozlov |
| 6,388,997 B1 | 5/2002 | Scott |
| 6,463,049 B1 | 10/2002 | Abe |
| 6,483,856 B1 | 11/2002 | Bird |
| 6,940,931 B2 | 9/2005 | Ito |
| 6,999,440 B2 | 2/2006 | Abe |
| 7,146,516 B2 | 12/2006 | Dhupar |
| 7,170,884 B1 | 1/2007 | Radimirsch |
| 7,174,258 B2 | 2/2007 | Hart |
| 7,266,713 B2 | 9/2007 | Lienhart |
| 7,272,201 B2 | 9/2007 | Whitehead |
| 7,363,009 B2 | 4/2008 | Erlenbach |
| 7,375,683 B2 | 5/2008 | Smith |
| 7,398,411 B2 | 7/2008 | Zweigle |
| 7,436,232 B2 | 10/2008 | Sivero |
| 7,440,427 B1 | 10/2008 | Katz |
| 7,573,913 B2 | 8/2009 | Terry |
| 7,577,220 B2 | 8/2009 | Becker |
| 7,606,541 B1 | 10/2009 | Nicholls |
| 7,616,682 B2 | 11/2009 | Small |
| 7,617,408 B2 | 11/2009 | Frazier |
| 7,714,735 B2 | 5/2010 | Rockwell |
| 7,746,269 B2 | 6/2010 | Kamimura |
| 7,940,213 B2 | 5/2011 | Harper |
| 7,952,519 B1 | 5/2011 | Nielsen |
| 7,978,130 B1 | 7/2011 | Cohen |
| 7,979,228 B2 | 7/2011 | Zurbuchen |
| 7,986,270 B2 | 7/2011 | Heidari-Bateni |
| 8,055,288 B2 | 11/2011 | Ladd |
| 8,082,367 B2 | 12/2011 | Etheridge et al. |
| 8,138,972 B2 | 3/2012 | Underbrink |
| 8,145,247 B2 | 3/2012 | Fullam |
| 8,159,391 B2 | 4/2012 | Papadimitratos |
| 8,237,609 B2 | 8/2012 | Talbot |
| 8,325,087 B2 | 12/2012 | Thomson |
| 8,326,319 B2 | 12/2012 | Davis |
| 8,446,896 B2 | 5/2013 | Bedrosian |
| 8,564,330 B1 | 10/2013 | Radulov |
| 8,655,608 B2 | 2/2014 | Guzman-Casillas |
| 8,712,244 B2 | 4/2014 | Hasegawa |
| 8,867,520 B2 | 10/2014 | Nicholls |
| 9,083,503 B2 | 7/2015 | Sagen |
| 9,270,442 B2 | 2/2016 | Rice |
| 9,319,100 B2 | 4/2016 | Achanta |
| 2001/0023464 A1 | 9/2001 | Deck |
| 2002/0136172 A1 | 9/2002 | Chun |
| 2002/0158693 A1 | 10/2002 | Soong |
| 2002/0167934 A1 | 11/2002 | Carter |
| 2003/0084190 A1 | 5/2003 | Kimball |
| 2003/0087654 A1 | 5/2003 | Wheeler |
| 2003/0107513 A1 | 6/2003 | Abraham |
| 2004/0062279 A1 | 4/2004 | Primrose |
| 2004/0166879 A1 | 8/2004 | Meadows |
| 2004/0228368 A1 | 11/2004 | Jecmen |
| 2006/0259806 A1 | 11/2006 | Zweigle |
| 2007/0132773 A1 | 6/2007 | Plante |
| 2007/0194987 A1 | 8/2007 | Fedora |
| 2008/0062039 A1 | 3/2008 | Cohen |
| 2008/0169978 A1 | 7/2008 | Powell |
| 2008/0186229 A1 | 8/2008 | Van Diggelen |
| 2008/0198069 A1 | 8/2008 | Gronemeyer |
| 2009/0117928 A1 | 5/2009 | Ladd |
| 2009/0160705 A1 | 6/2009 | Matsuzaki |
| 2009/0310570 A1 | 12/2009 | Smith |
| 2009/0315764 A1 | 12/2009 | Cohen |
| 2010/0030916 A1 | 2/2010 | Greenwood Graham |
| 2010/0034190 A1 | 2/2010 | Yun |
| 2010/0073228 A1 | 3/2010 | Smith |
| 2010/0117899 A1 | 5/2010 | Papadimitratos |
| 2010/0127928 A1 | 5/2010 | Thomson |
| 2010/0190509 A1 | 7/2010 | Davis |
| 2010/0222068 A1 | 9/2010 | Gaal |
| 2010/0231445 A1 | 9/2010 | Tarlow |
| 2010/0231448 A1 | 9/2010 | Harper |
| 2010/0253578 A1 | 10/2010 | Mantovani |
| 2010/0254225 A1 | 10/2010 | Schweitzer, III |
| 2011/0001668 A1 | 1/2011 | Cobb |
| 2011/0035066 A1 | 2/2011 | Schweitzer |
| 2011/0068973 A1 | 3/2011 | Humphreys |
| 2011/0085540 A1 | 4/2011 | Kuwabara |
| 2011/0102258 A1 | 5/2011 | Underbrink |
| 2011/0102259 A1 | 5/2011 | Ledvina |
| 2011/0169577 A1 | 7/2011 | Nicholls |
| 2011/0181466 A1 | 7/2011 | Serrano |
| 2011/0227787 A1 | 9/2011 | Gum |
| 2011/0261917 A1 | 10/2011 | Bedrosian |
| 2011/0285586 A1 | 11/2011 | Ferguson |
| 2011/0287779 A1 | 11/2011 | Harper |
| 2012/0005326 A1 | 1/2012 | Bradetich |
| 2012/0026037 A1 | 2/2012 | Thomson |
| 2012/0030495 A1 | 2/2012 | Chandhoke |
| 2012/0066418 A1 | 3/2012 | Foster |
| 2012/0116677 A1 | 5/2012 | Higgison |
| 2012/0179404 A1 | 7/2012 | Lee |
| 2012/0182181 A1 | 7/2012 | Dai |
| 2012/0195253 A1 | 8/2012 | Irvine |
| 2012/0195350 A1 | 8/2012 | Das |
| 2012/0323397 A1 | 12/2012 | Schweitzer, III |
| 2013/0157593 A1 | 6/2013 | Achanta |
| 2013/0244624 A1 | 9/2013 | Das |
| 2013/0328606 A1 | 12/2013 | Ravi |
| 2013/0335266 A1 | 12/2013 | Vollath |
| 2014/0003199 A1 | 1/2014 | Dougan |
| 2014/0094218 A1 | 4/2014 | Hammes |
| 2014/0100702 A1 | 4/2014 | Schweitzer |
| 2014/0111377 A1 | 4/2014 | Achanta |
| 2014/0114608 A1 | 4/2014 | Achanta |
| 2014/0232595 A1 | 8/2014 | Rife |
| 2014/0247185 A1 | 9/2014 | Achanta |
| 2014/0250972 A1 | 9/2014 | Achanta et al. |
| 2014/0327574 A1 | 11/2014 | Achanta |
| 2014/0334477 A1 | 11/2014 | Stahlin |
| 2015/0043697 A1 | 2/2015 | Achanta |

FOREIGN PATENT DOCUMENTS

| | | |
|---|---|---|
| WO | 2012151006 | 11/2012 |
| WO | 2014005016 | 1/2014 |

OTHER PUBLICATIONS

Tippenhauer, N.O., Popper, C., Rasmussen, K.B., Capkun, S., On the Requirements for Successful GPS Spoofing Attacks, In Proceedings of the ACM Conference on Computer and Communications Security (CCS), Oct. 2011.

Moore, P., Crossley, P., GPS Applications in Power Systems Part 1 Introduction to GPS, Tutorial: GPS in Power Systems, Power Engineering Journal, Feb. 1999.

Jafarnia-Jahromi, A., Broumandan, A., Nielsen, J., Lachapelle, G., "GPS Vulnerability to Spoofing Threats and a Review of Antispoofing Techniques", International Journal of Navigation and Observation vol. 2012, Article ID 127072, Feb. 2012.

Wullems, C., "A Spoofing Detection Method for Civilian L1 GPS and the E1-B Galileo Safety of Life Service". IEEE Transactions on Aerospace and Electronic Systems, Aug. 2011.

Wen, H., Huang, P. Y., Dyer, J., Archinal, A., Fagan, J., "Countermeasures for GPS Signal Spoofing," Proceedings of the 18th International Technical Meeting of the Satellite Division of the Institute of Navigation (ION GNSS 2005), Long Beach, CA, Sep. 2005, pp. 1285-1290.

Gurtner, W., Estey, L., "Rinex: The Receiver Independent Exchange Format Version 3.00", Nov. 28, 2007.

(56) References Cited

OTHER PUBLICATIONS

Gurtner, W., "Rinex: The Receiver Independent Exchange Format Version 2", Sep. 2008.
PCT/US2013/064012, Patent Cooperation Treaty, International Search Report and Written Opinion of the International Searching Authority, Dec. 19, 2013.
PCT/US2013/058297, Patent Cooperation Treaty, International Search Report and Written Opinion of the International Searching Authority, Feb. 14, 2014.
PCT/US2013/065695, Patent Cooperation Treaty, International Search Report and Written Opinion of the International Searching Authority, Mar. 10, 2014.
PCT/US2013/065447, Patent Cooperation Treaty, International Search Report and Written Opinion of the International Searching Authority, Mar. 13, 2014.
PCT/US2014/049813 Patent Cooperation Treaty, International Search Report and Written Opinion of the International Searching Authority, Apr. 2, 2015.
PCT/US2014/034358 Patent Cooperation Treaty, International Search Report and Written Opinion of the International Searching Authority, Sep. 22, 2014.
Zhou et al., Adaptive Correction Method for an OCXO and Investigation of Analytic Cumulative Time Error Upper Bound, Jan. 2011, IEEE Transactions on Ultrasonics, Ferroelectrics, and Frequency Control, vol. 58, No. 1.
PCT/US2014/010507 Patent Cooperation Treaty, International Search Report and Written Opinion of the International Searching Authority, May 6, 2014.
PCT/US2015/024000 Patent Cooperation Treaty, International Search Report and Written Opinion of the International Searching Authority, Jul. 13, 2015.
PCT/US2015/029939 Patent Cooperation Treaty, International Search Report and Written Opinion of the International Searching Authority, Aug. 12, 2015.
Shepard, D., Humphreys, T., Fansler, A., "Evaluation of the Vulnerability of Phasor Measurement Units to GPS Spoofing Attacks", Oct. 2, 2011.
PCT/US2014/010422 Patent Cooperation Treaty, International Search Report and Written Opinion of the International Searching Authority, Sep. 16, 2014.
PCT/US2015/054144 Patent Cooperation Treaty, International Search Report and Written Opinion of the International Searching Authority, Jan. 4, 2016.
North American SynchroPhasor Initiative (NASPI), Performance & Standards Task Team (PSTT), Guidelines for Synchronization Techniques Accuracy and Availability, Dec. 30, 2008.
D. Mills, Network Working Group, Request for Comments 4330, Simple Network Time Protocol (SNTP) Version 4 for IPv4, IPv6, and OSI, Jan. 2006.
PCT/US2012/068915 Patent Cooperation Treaty, International Search Report and Written Opinion of the International Searching Authority, Mar. 26, 2013.

TIME DISTRIBUTION SWITCH

RELATED APPLICATION

The present application claims the benefit under 35 U.S.C. §119(e) of U.S. Provisional Patent Application No. 61/716,310 filed 19 Oct. 2012 and titled "Time Distribution Switch" which application is incorporated herein by reference in its entirety.

TECHNICAL FIELD

This disclosure relates to detecting the failure of a precision time source using an independent time source. Particularly, this disclosure relates to detecting the failure of a precision time source in an electric power transmission or distribution system.

BRIEF DESCRIPTION OF THE DRAWINGS

Non-limiting and non-exhaustive embodiments of the disclosure are described, including various embodiments of the disclosure with reference to the figures, in which.

Figure 1:
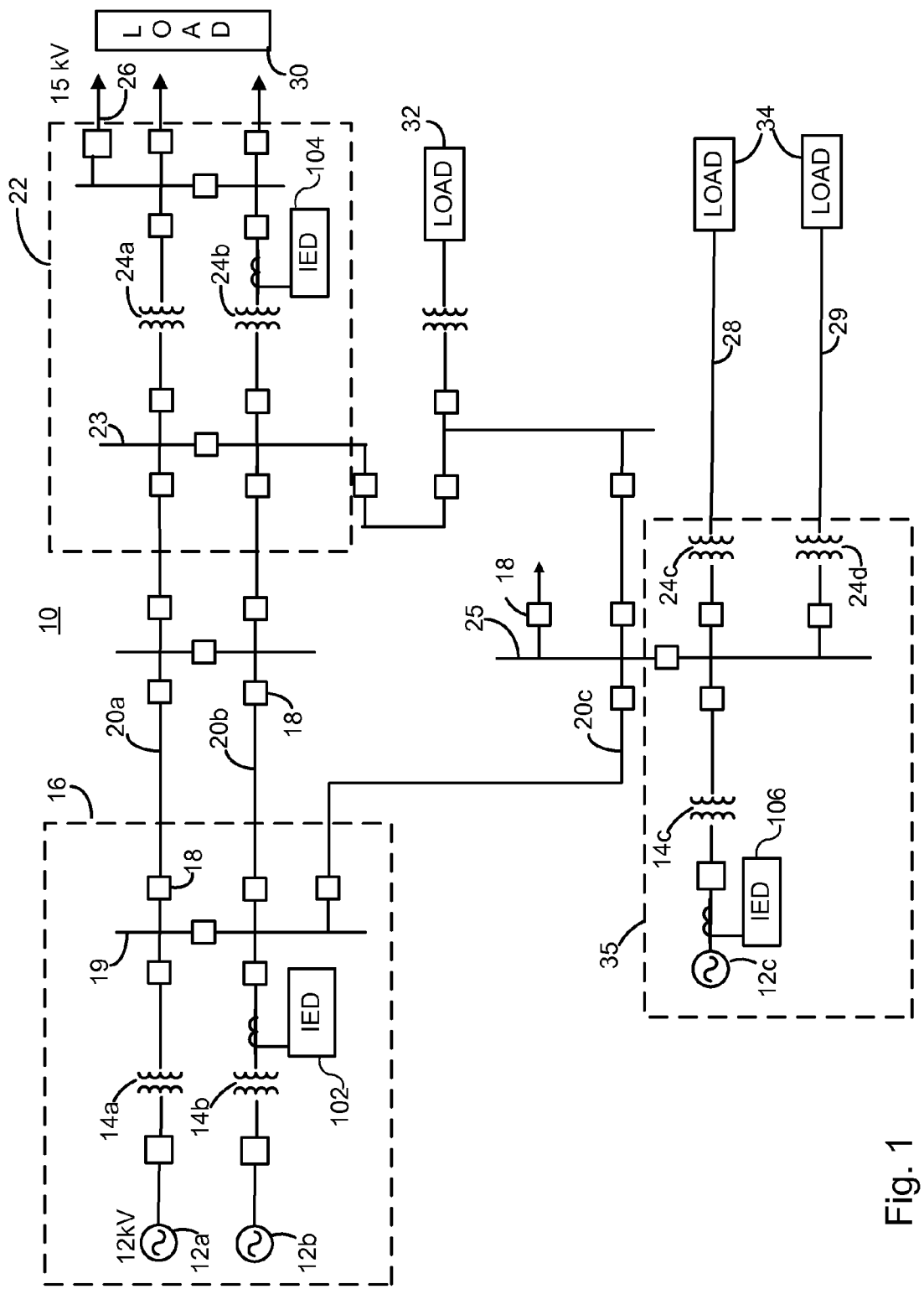
FIG. 1 is a one-line diagram of an electric power delivery system.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power transmission and distribution systems may utilize precision time information to perform various monitoring, protection, and communication tasks. In connection with certain applications, intelligent electronic devices (IEDs) and network communication devices may utilize time information accurate beyond the millisecond range. IEDs within a power system may be configured to perform metering, control, and protection functions that require a certain level of precision between one or more IEDs. For example, IEDs may be configured to calculate and communicate time-synchronized phasors (synchrophasors), which may require that the IEDs and network devices be synchronized to within nanoseconds of one other. Many protection, metering, control, and automation algorithms used in power systems may benefit from or require receipt of precision time information.

Various systems may be used for distribution of precision time information. According to various embodiments disclosed herein, a power system may include components connected using a synchronized optical network (SONET). In such embodiments, precision time information may be distributed using a synchronous transport protocol and synchronous transport modules (STMs). According to one embodiment, a precision time reference can be transmitted within a frame of a SONET transmission. In another embodiment, a precision time reference may be incorporated into a header or an overhead portion of a SONET STM frame. Similarly, the power system may include components connected using Synchronous Digital Hierarchy (SDH) protocol. Although several embodiments herein are described in terms of SONET, it should be recognized that the SDH protocol may be used in place of SONET unless otherwise specified.

IEDs, network devices, and other devices in a power system may include local oscillators or other time sources and may generate a local time signal. In some circumstances, however, external time signals, provided by a time distribution device, may be more precise and may therefore be preferred over local time signals. A power system may include a data communications network that transmits a precision time reference from the time distribution device to time dependent devices connected to the data communications network. In some embodiments, the communications network may include one or more local area networks (LANs) and one or more wide area networks (WANs). In a system with multiple LANs, multiple time distribution devices (one or more for each LAN) may be connected to the data communications network and each time distribution device can provide a precision time reference to other time distribution devices across the WAN. In each time distribution device, the precision time reference may be received or derived from an external precision time signal.

According to various embodiments, each time distribution device receives multiple precision time signals from various time sources and is configured to provide the best available precision time signal as the precision time reference. The precision time signals may be received using an Inter-Range Instrumentation Group (IRIG) protocol, a global navigation satellite system (GNSS, such as, for example, global positioning system (GPS), GLONASS, or the like), a radio broadcast such as a National Institute of Science and Technology (NIST) broadcast (e.g., radio stations WWV, WWVB, and WWVH), the IEEE 1588 protocol, a network time protocol (NTP) codified in RFC 1305, a simple network time protocol (SNTP) in RFC 2030, and/or another time transmission protocol or system.

While, the above listed precision time signals may provide accurate time to a time distribution device, they vary in quality. For example, the precision of NTP and SNTP is limited to the millisecond range, thus making it inappropriate for sub-millisecond time distribution applications. Further, both protocols lack security and are susceptible to malicious network attacks. The IEEE 1588 standard includes hardware-assisted timestamps, which allows for time accuracy in the nanosecond range. Such precision may be sufficient for more demanding applications (e.g., the sampling of the sinusoidal currents and voltages on power lines to calculate "synchrophasors"). It is well suited for time distribution at the communication network periphery, or among individual devices within the network. GNSS time signals provide a very accurate and robust time measurement, however GNSS signals are susceptible to spoofing. Therefore, it would be beneficial to provide a system and method for detecting failure in any of the received precision time signals such that the best available precision time reference can be provided to time dependent devices.

In certain embodiments, when the time distribution device determines that the connection to the best available time source has failed, a new best available time source may be selected from the remaining available time sources. In addition to relying on a precision time reference from the time distribution device, when available, the various time dependent devices may be configured to enter a holdover period when the precision time reference is unavailable. In some embodiments, a device may be configured to monitor the drift of a local time source with respect to the precision time reference and to retain information regarding the drift. During the holdover period, an IED or network device may rely on a local time signal.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and a product of a process.

The phrases "connected to," "networked," and "in communication with" refer to any form of interaction between two or more entities, including mechanical, electrical, magnetic, and electromagnetic interaction. Two components may be connected to each other even though they are not in direct physical contact with each other and even though there may be intermediary devices between the two components.

Some of the infrastructure that can be used with embodiments disclosed herein is already available, such as: general-purpose computers, computer programming tools and techniques, digital storage media, and optical networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as non-volatile memory, static RAM, dynamic RAM, ROM, CD-ROM, disk, tape, magnetic, optical, flash memory, or other computer readable storage medium.

As used herein, the term IED may refer to any microprocessor-based device that monitors, controls, automates, and/or protects monitored equipment within the system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

IEDs, network devices, and time distribution devices may be physically distinct devices, may be composite devices, or may be configured in a variety of ways to perform overlapping functions. IEDs, network devices, and time distribution devices may comprise multi-function hardware (e.g., processors, computer-readable storage media, communications interfaces, etc.) that can be utilized in order to perform a variety of tasks, including tasks typically associated with an IED, network device, and/or time distribution device. For example, a network device, such as a multiplexer, may also be configured to issue control instructions to a piece of monitored equipment. In another example, an IED may be configured to function as a firewall. The IED may use a network interface, a processor, and appropriate software instructions stored in a computer-readable storage medium in order to simultaneously function as a firewall and as an IED. In another example, an IED may include the necessary hardware and software instructions to function as a time distribution device for other IEDs in a LAN or WAN. In order to simplify the discussion, several embodiments disclosed herein are illustrated in connection with time distribution devices; however, one of skill in the art will recognize that the teachings of the present disclosure, including those teachings illustrated only in connection with time distribution devices, are also applicable to IEDs and network devices.

Aspects of certain embodiments described herein may be implemented as software modules or components. As used herein, a software module or component may include any type of computer instruction or computer executable code located within a computer readable storage medium. A software module may, for instance, comprise one or more physical or logical blocks of computer instructions, which may be organized as a routine, program, object, component, data structure, etc., that performs one or more tasks or implements particular abstract data types.

In certain embodiments, a particular software module may comprise disparate instructions stored in different locations of a computer readable storage medium, which together implement the described functionality of the module. Indeed, a module may comprise a single instruction or many instructions, and may be distributed over several different code segments, among different programs, and across several computer readable storage media. Some embodiments may be practiced in a distributed computing environment where tasks are performed by a remote processing device linked through a communications network. In a distributed computing environment, software modules may be located in local and/or remote computer readable storage media. In addition, data being tied or rendered together in a database record may be resident in the same computer readable storage medium, or across several computer readable storage media, and may be linked together in fields of a record in a database across a network.

The software modules described herein tangibly embody a program, functions, and/or instructions that are executable by computer(s) to perform tasks as described herein. Suitable software, as applicable, may be readily provided by those of skill in the pertinent art(s) using the teachings presented herein and programming languages and tools, such as XML, Java, Pascal, C++, C, database languages, APIs, SDKs, assembly, firmware, microcode, and/or other languages and tools.

A precision time reference refers to a time signal or time source relied on by a plurality of devices and distributed by a time distribution device, and which is presumed to be more precise than a local time source. The determination of accuracy may be made based upon a variety of factors. A precision time reference may allow for specific moments in time to be described and temporally compared to one another.

A time source is any device that is capable of tracking the passage of time. A variety of types of time sources are contemplated, including a voltage-controlled temperature compensated crystal oscillator (VCTCXO), a phase locked loop oscillator, a time locked loop oscillator, a rubidium oscillator, a cesium oscillator, a trained oscillator, a microelectromechanical device (MEM), and/or other device capable of tracking the passage of time.

A time signal is a representation of the time indicated by a time source. A time signal may be embodied as any form of communication for communicating time information. A wide variety of types of time signals are contemplated, including an Inter-Range Instrumentation Group (IRIG) protocol, a global navigation satellite system (GNSS, such as, for example, global positioning system (GPS), GLONASS, or the like), a radio broadcast such as a National Institute of Science and Technology (NIST) broadcast (e.g., radio stations WWV, WWVB, and WWVH), the IEEE 1588 protocol, a network time protocol (NTP) codified in RFC 1305, a simple network time protocol (SNTP) in RFC 2030, and/or another time transmission protocol or system. Time source and time signal may be used interchangeably herein.

Failure of a precision time source and/or precision time signal, as used herein, includes spoofing and/or jamming the signal, mechanical or software failures, system wide outages, etc.

Furthermore, the described features, operations, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order, unless specified to require an order.

FIG. 1 illustrates a one-line diagram of an electric power delivery system 10. The delivery system 10 includes intelligent electronic devices (IEDs) 102, 104, and 106 utilizing a precision time reference to monitor, protect, and/or control system components. The electric power transmission and delivery system 10 illustrated in FIG. 1 includes three geographically separated substations 16, 22, and 35. Substations 16 and 35 include generators 12a, 12b, and 12c. The generators 12a, 12b, and 12c generate electric power at a relatively low voltage, such as 12 kV. The substations include step-up transformers 14a, 14b, and 14c to step up the voltage to a level appropriate for transmission. The substations include various breakers 18 and buses 19, 23, and 25 for proper transmission and distribution of the electric power. The electric power may be transmitted over long distances using various transmission lines 20a, 20b, and 20c.

Substations 22 and 35 include step-down transformers 24a, 24b, 24c, and 24d for stepping down the electric power to a level suitable for distribution to various loads 30, 32, and 34 using distribution lines 26, 28, and 29.

IEDs 102, 104, and 106 are illustrated in substations 16, 22, and 35 configured to protect, control, meter and/or automate certain power system equipment or devices. According to several embodiments, numerous IEDs are used in each substation; however, for clarity only a single IED at each substation is illustrated. IEDs 102, 104, and 106 may be configured to perform various time dependent tasks including, but not limited to, monitoring and/or protecting a transmission line, distribution line, and/or a generator. Other IEDs included in a substation may be configured as bus protection relays, distance relays, communications processors, automation controllers, transformer protection relays, and the like. As each IED or group of IEDs may be configured to communicate on a local area network (LAN) or wide area network (WAN), each IED or group of IEDs may be considered a node in a communications network.

As discussed above, an IED may be configured to calculate and communicate synchrophasors with other IEDs. To accurately compare synchrophasors obtained by geographically separate IEDs, each IED may need to be synchronized with a precision time reference with accuracy greater than a millisecond to allow for time-aligned comparisons. According to various embodiments, time synchronization, accurate to the microsecond or nanosecond range, may allow IEDs to perform accurate comparisons of synchrophasors.

Figure 2:
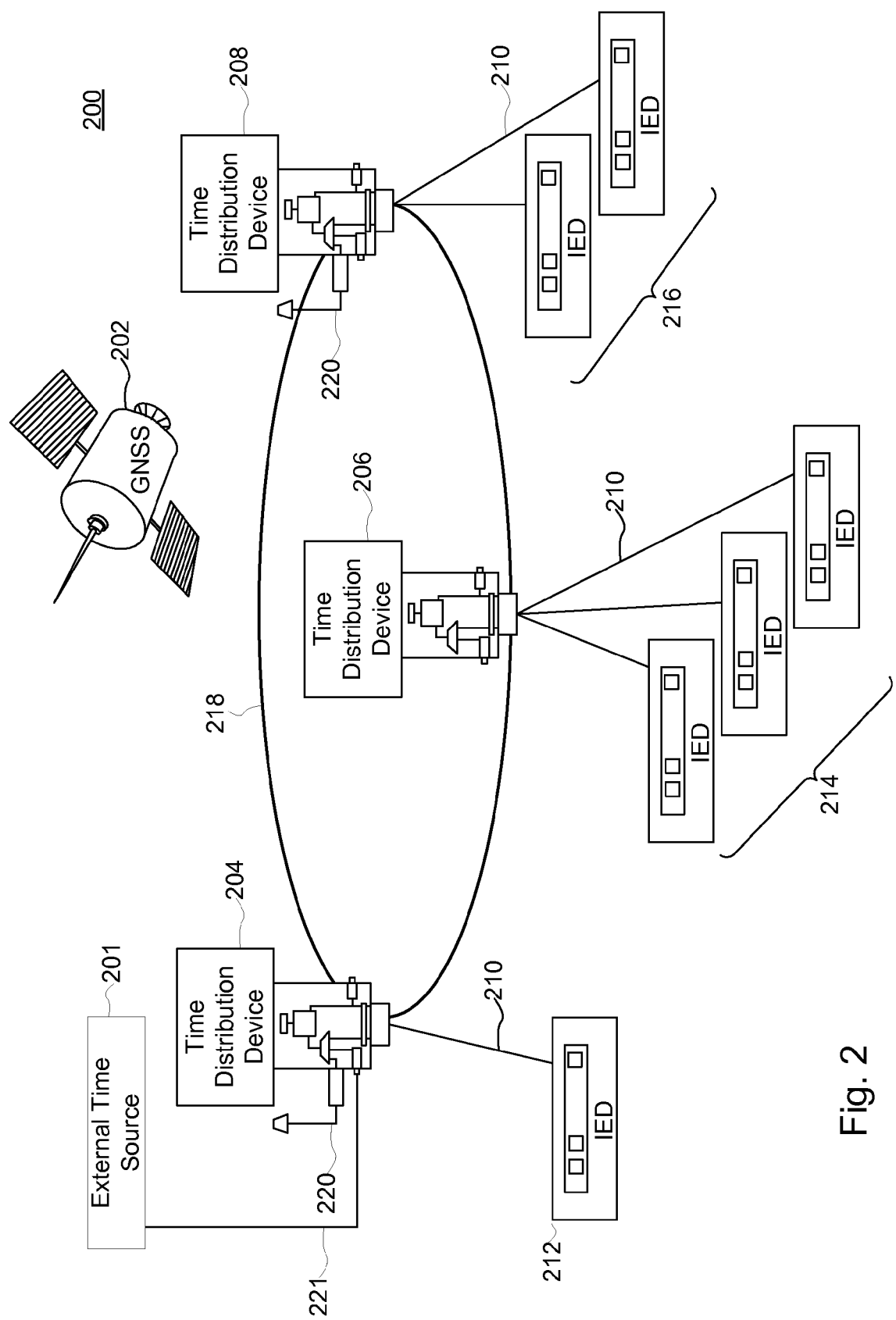
FIG. 2 illustrates a time distribution system including communications IEDs configured to distribute a precision time reference to various IEDs.

FIG. 2 illustrates system 200 configured to be a highly reliable, redundant, and distributed system of time distribution devices 204, 206, and 208 capable of providing a precision time reference to various time dependent IEDs 212, 214, and 216. Each time distribution device 204, 206, and 208 may be configured to receive and communicate time signals through multiple protocols and methods. While the system 200 is described as being capable of performing numerous functions and methods, it should be understood that various systems are possible that may have additional or fewer capabilities. Specifically, a system 200 may function as desired using only one protocol, or having fewer external or local time signal inputs.

As illustrated in FIG. 2, three time distribution devices 204, 206, and 208 have WAN capabilities and are communicatively connected to a WAN 218, which may comprise one or more physical connections and protocols. Each time distribution device 204, 206, and 208 may also be connected to one or more IEDs within a local network. For example, time distribution device 204 is connected to IED 212, time distribution device 206 is connected to IEDs 214, and time distribution device 208 is connected to IEDs 216. A time distribution device may be located at, for example, a power generation facility, a hub, a substation, a load center, or other location where one or more IEDs are found. In various embodiments, an IED may include a WAN port, and such an IED may be directly connected to WAN 218. IEDs may be connected via WAN 218 or connection 210. Connection 210 may be, for example, a local area network (LAN) or a dedicated time communication link, such as an Inter-Range Instrumentation Group (IRIG) compliant communication link. In various embodiments, connection 210 may include multiple connections, for example, both a LAN and IRIG connection. Time distribution devices 204, 206, and 208 may establish and maintain a precision time reference among various system components. Each time distribution device 204, 206, and 208 may be configured to communicate time information with IEDs connected on connection 210 through one or more time distribution protocols, such as IEEE 1588.

Each time distribution device 204, 206, and 208 is configured to receive time signals from a variety of time sources. For example, as illustrated, time distribution device 204 includes an antenna 220 and is configured to receive a GNSS signal from a GNSS repeater or satellite 202. Time distribution device 204 is also configured to receive a second time signal 221 from an external time source 201. The external time source may comprise one or more VCTCXOs, phase locked loop oscillators, time locked loop oscillators, rubidium oscillators, cesium oscillators, NIST broadcasts (e.g., WWV and WWVB), and/or other devices capable of generating precise time signals. In the illustrated embodiment, time distribution device 208 includes an antenna 220 configured to receive a GNSS signal from the GNSS repeater or satellite 202. As illustrated, time distribution device 206 does not directly receive an external time signal, however, according to alternative embodiments, any number and variety of external time signals may be available to any of the time distribution devices.

According to one embodiment, WAN 218 comprises a SONET configured to embed a precision time reference in a header or overhead portion of a SONET frame during transmission. Alternatively, a precision time reference may be conveyed using any number of time communications methods including IRIG protocols, NTP, SNTP, synchronous transport protocols (STP), and/or IEEE 1588 protocols. According to various embodiments, including transmission via SONET, a precision time reference may be separated and protected from the rest of the WAN network traffic, thus creating a secure time distribution infrastructure. Protocols used for inter IED time synchronization may be proprietary, or based on a standard, such as IEEE 1588 Precision Time Protocol (PTP).

According to various embodiments, time distribution devices 204, 206, and 208 are configured to perform at least one of the methods of detecting failure of a time source described herein. System 200 may utilize a single method or combination of methods, as described herein.

It is of note that even the most precise time signals may exhibit small discrepancies. For example, depending on the length and routing of the GNSS antenna cable, various clocks may exhibit microsecond level time offsets. Some of these offsets may be compensated by the user entering compensation settings, or may need to be estimated by the time synchronization network. Estimation may be performed during long periods of "quiet" operation (i.e., periods with no faults), with the individual source results stored locally in a nonvolatile storage register.

Figure 3:
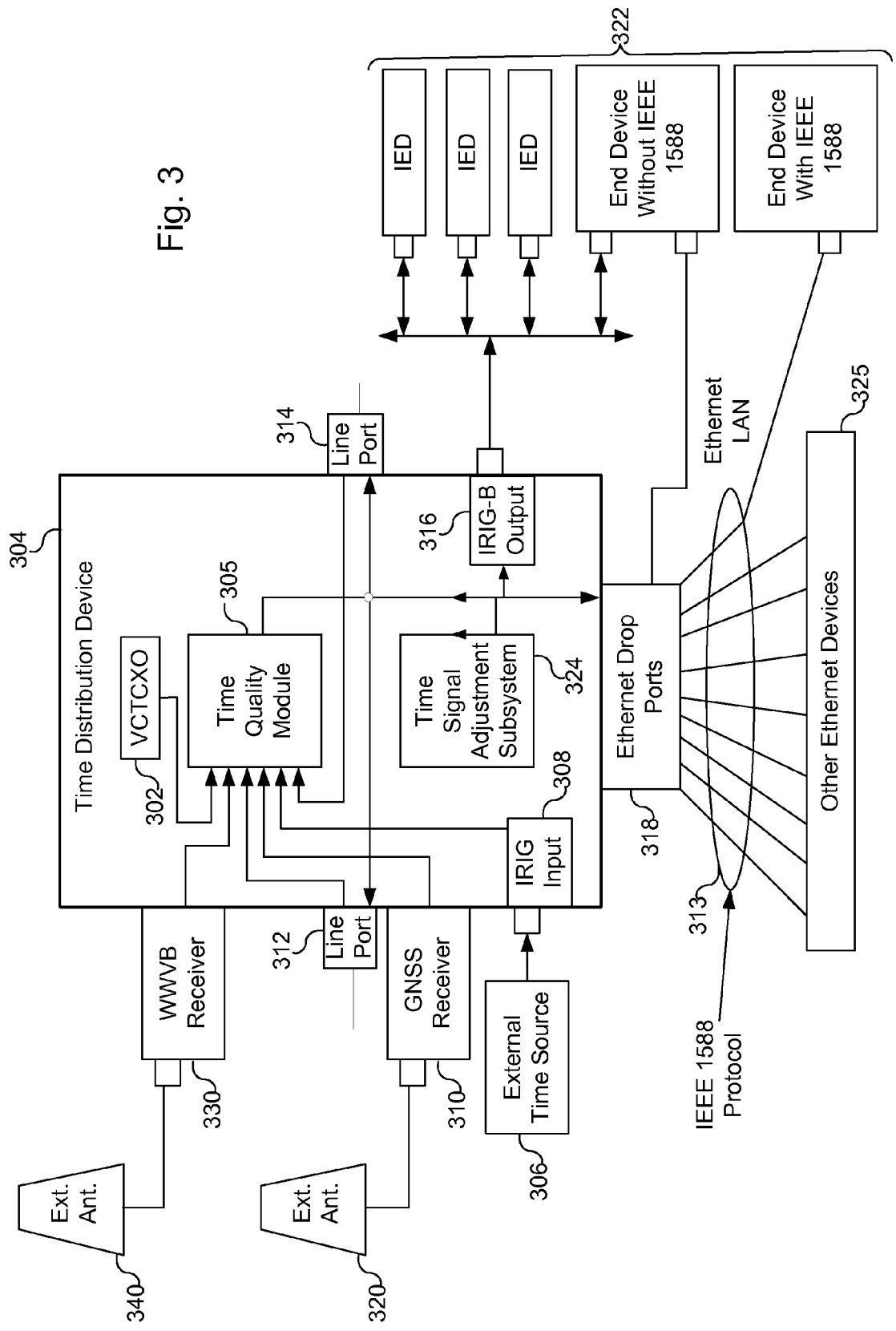
FIG. 3 illustrates an embodiment of a time distribution device configured to receive, distribute, and/or determine a precision time reference.

FIG. 3 illustrates a time distribution device 304, according to one embodiment. A time distribution device 304 may include more or less functionality than the illustration. For example, time distribution device 304 may include an interface for monitoring equipment in an electric power delivery system in certain embodiments. Accordingly, in various embodiments time distribution device 304 may be implemented either as an IED or as a network device. As illustrated, time distribution device 304 includes a local time source 302 that provides a local time signal and a time quality module 305 for establishing a precision time reference. Time distribution device 304 further includes a pair of line ports 312 and 314 for communications with a WAN or LAN. Time information may be shared over a network and may also be fed into the time quality module 305. Further, time distribution device 304 includes a GNSS receiver 310 for receiving a precision time signal, such as time from a GNSS via a GNSS antenna 320. Time distribution device 304 also includes a WWVB receiver 330 for receiving an NIST broadcast, which can be used as a precision time signal, via an external antenna 340. The received precision time signal from either source is communicated to the time quality module 305 for use in determining and distributing the precision time reference.

Another time source that may be fed to the time quality module 305 includes an external time source 306 that may conform to a time distribution protocol, such as IRIG. The external time source 306 may communicate with another time port such as an IRIG input 308.

The various time information from the WAN (from line ports 312 and/or 314), GNSS receiver 310, WWVB receiver 330, and IRIG input 308 are input into the time quality module 305. In one embodiment, the inputs may be fed into a multiplexer (not shown) prior to being input into the time quality module 305. The time quality module 305 functions to determine a precision time reference for use by the various devices connected to the time distribution device 304. The precision time reference is then communicated from the time quality module 305 to the various devices 322 using IRIG protocol (via the IRIG-B output 316) or to various devices 325 using another protocol 313 such as IEEE 1588 using Ethernet Drop Ports 318. The Ethernet Drop Ports 318 may also include network communications to the various devices connected to time distribution device 304. Time distribution device 304 may further include connections to SONETs and transmit the precision time reference in a header or overhead portion of SONET frames.

Time distribution device 304 may also comprise a time signal adjustment subsystem 324. Time signal adjustment subsystem 324 may be configured to track drift rates associated with various external time sources with respect to local time source 302. Time signal adjustment subsystem 324 may also communicate time signals according to a variety of protocols. Such protocols may include inter-Range Instrumentation Group protocols, IEEE 1588, Network Time Protocol, Simple Network Time Protocol, synchronous transport protocol, and the like. In various embodiments, time signal adjustment subsystem 324 may be implemented using a processor in communication with a computer-readable storage medium containing machine executable instructions. In other embodiments, time signal adjustment subsystem 324 may be embodied as hardware, such as an application specific integrated circuit or a combination of hardware and software.

According to various embodiments, the time quality module 305 determines whether a primary or "best available" time source is reliable, i.e., has not failed, and distributes the time signal from the best available time source as the precision time reference to time dependent devices in the system. If the best available time source has failed, the time quality module 305 provides an error alert to a user, and in some embodiments, enters a holdover period where an alternative time signal is used for the precision time reference. In some embodiments, the alternative time signal is determined by the time quality module and is chosen from the available time sources. In another embodiment, the time quality module calculates a common time from the available time signals and distributes the common time to the time dependent devices.

These techniques allow for the best available time source to be used as precision time reference provided to time dependent devices in a robust manner such that there is a high likelihood that the precision time reference is accurate. Moreover, in certain embodiments, relying on a secondary time source provided to the time quality module 305 as the precision time reference during a holdover period when the primary time reference has failed may provide more accurate time information than the holdover situation described above where a local oscillator in each time dependent device is used during the holdover.

Figure 4:
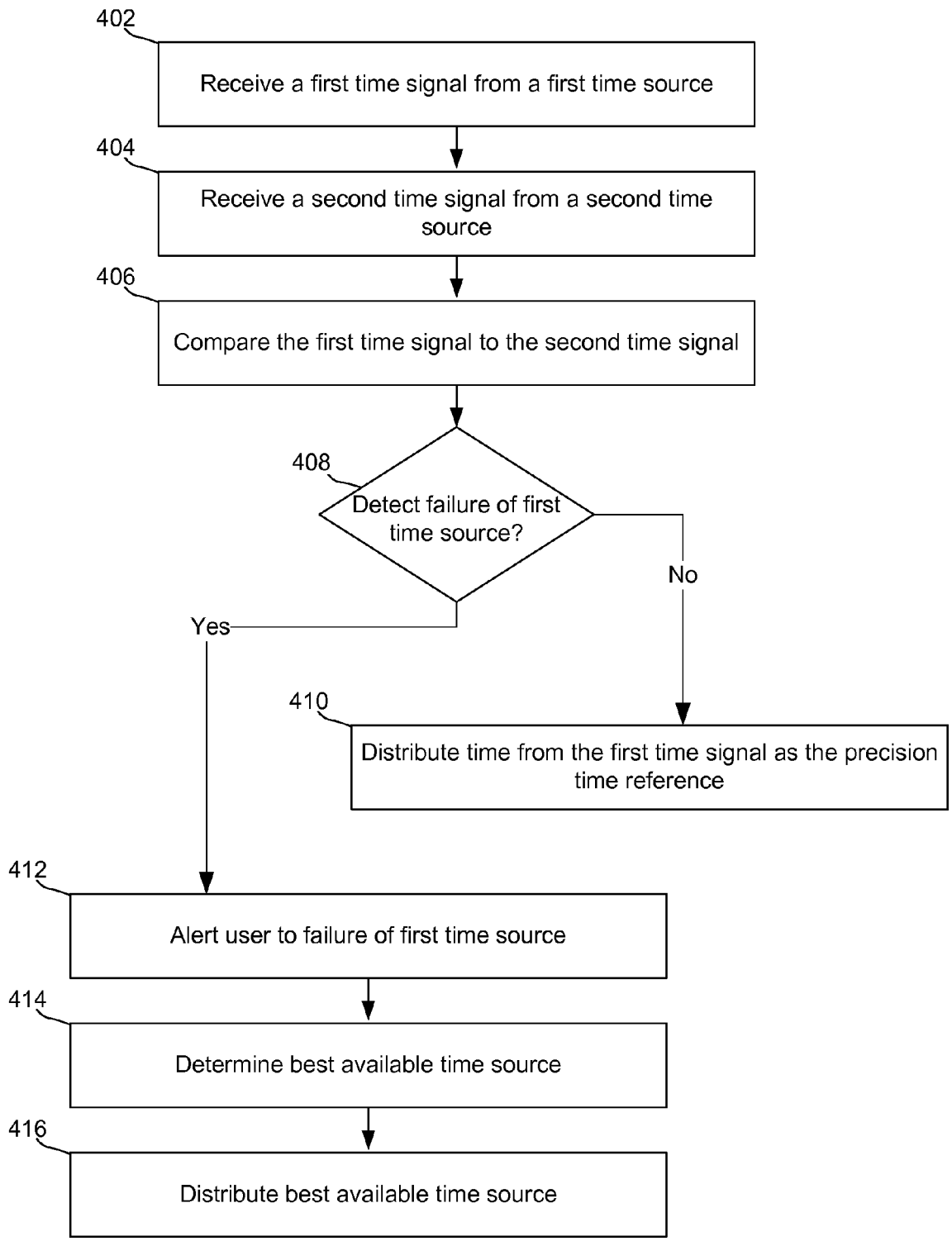
FIG. 4 illustrates one embodiment for determining whether a primary or best available time source has failed.

FIG. 4 illustrates one embodiment for determining whether a primary or best available time source has failed. While the time signals in the example of FIG. 4 are described as specific signals, other signals may be used with similar results. At 402 the time distribution device receives a first time signal from a first time source, or best available time source, and provides the time signal to the time quality module. In one embodiment, the first time source is a time signal received from a GNSS system. GNSS time has the advantages of relying on extremely accurate methods for providing the time signal to GNSS receivers, being readily available worldwide (particularly in remote locations) 24 hours per day, and is expected to be stable for many decades to come. GNSS receivers can keep an internal time, based on the GNSS signal that is accurate to better than nanoseconds and the time output at the 1 PPS dedicated time port is typically better than 1 microsecond.

At 404 the time distribution device receives a second time signal from a second time source. In one embodiment, the second time source is a NIST broadcast such as WWVB. While not as accurate as a time reference derived from a GNSS signal, a time reference derived from a WWVB broadcast is still very accurate. While the example of FIG. 4 specifically uses a WWVB broadcast as the second time source, one of skill in the art will recognize that other time sources, such as those described above, can be used in place of the WWVB broadcast.

At 406 the time quality module compares the first time signal to the second time signal. Each of the time signals received by the time quality module have an inherent error bound related to the accuracy of the time signal. In one embodiment, the time quality module compares the time signals with regard to their respective error bounds to determine whether the first time source has failed. For example, given the relatively smaller error bound found in the time derived from a GNSS signal compared to that found in a time derived from a WWVB broadcast, the time based on the GNSS signal should fall within the error bound of the time based on the WWVB broadcast. However, if the GNSS based time signal falls outside of the error bound of the WWVB based time signal, the time quality module detects, at 408, that there is an error with the GNSS based time signal.

If, at 408, the time quality module determines that the first time source has not failed, the time quality module distributes time from the first time signal as the precision time reference at 410. If, at 408, the time quality module determines that the first time source has failed, at 412 the time quality module alerts a user that the best available time source has failed and that the time may not be accurate. In addition to alerting a user of the failure, the time quality module at 414 can determine a best available time source and at 416 distribute the best available time source as the precision time reference. The process for determining the best available time source is described in more detail below with reference to FIG. 7.

While the example of FIG. 4 is limited to a first and second time signal, the time quality module can continue to compare time signals in order of relative error bounds beyond just a first and second time signal. For example, the WWVB based time may be compared to the time of a local oscillator (taking into account the drift rate of the oscillator) to determine whether the WWVB source has failed, etc.

Figure 5:
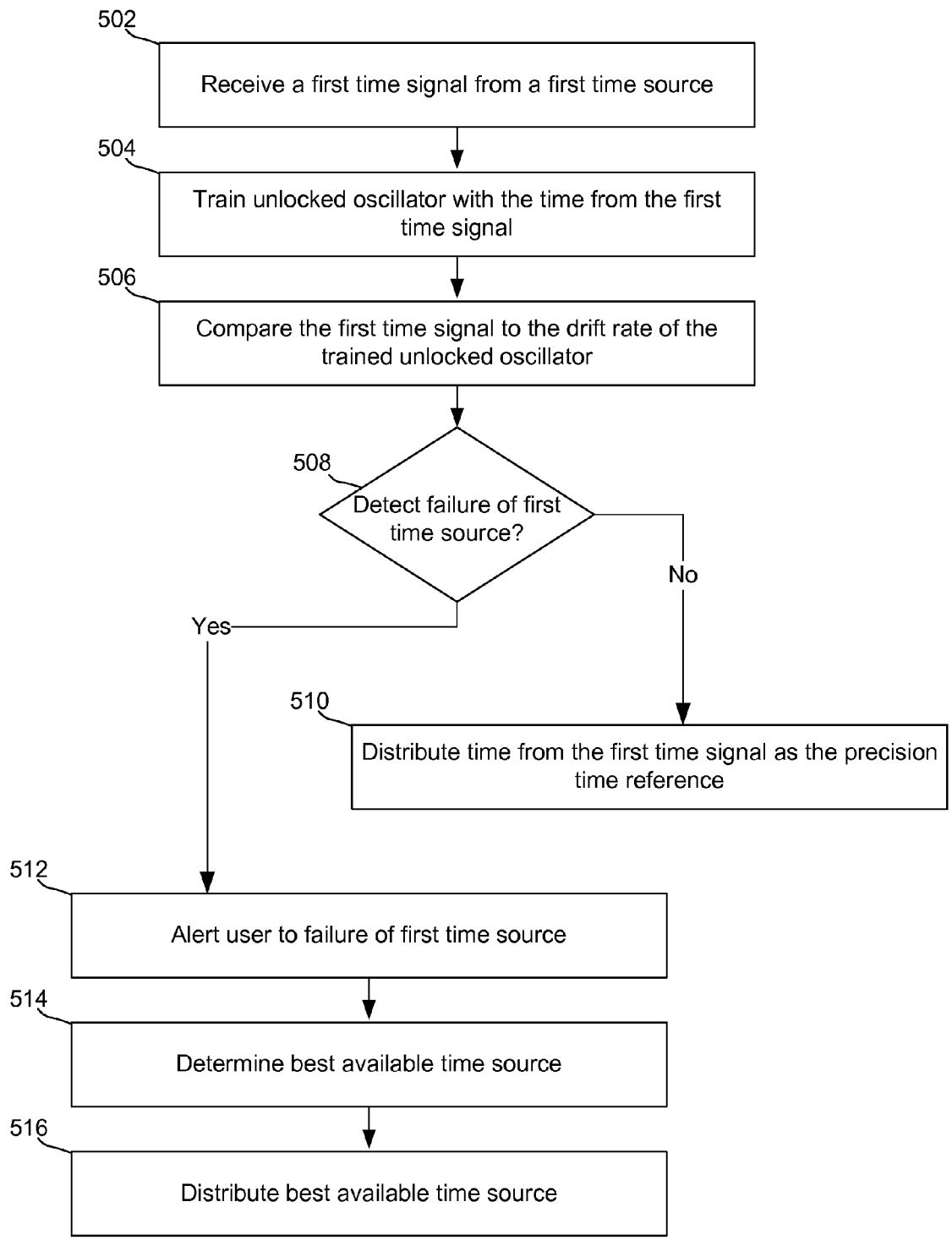
FIG. 5 illustrates another embodiment for determining whether a primary or best available time source has failed.

FIG. 5 illustrates a second embodiment for determining whether a primary or best available time source has failed. While the time signals in the example of FIG. 5 are described as specific signals, other signals may be used with similar results. At 502 the time distribution device receives a first time signal from a first time source, or best available time source, and provides the time signal to the time quality module. In one embodiment, the first time source is a time signal received from a GNSS system.

At 504 the time distribution device uses the first time signal to train an unlocked oscillator to track the time provided in the first time signal. While the oscillator is trained to track the time of the first time source, because the oscillator is unlocked the time provided by the trained oscillator will drift from that of the first time signal. However, the rate of drift is low and the time distribution device maintains the training relationship between the first signal and the oscillator such that the drift is corrected.

At 506 the time quality module compares the first time signal to the trained oscillator (again, taking into account the drift rate associated with the trained oscillator). In one embodiment, a counter tracks the number of oscillations of the oscillator between each PPS received from the first time signal. Because the oscillator is trained to the first time signal, any variation in the oscillation count from PPS to PPS should be low. If there is a large jump in the variation in the oscillation count, the time quality module, at 508, detects a failure of the first time source. The threshold for determining whether the time quality module detects a failure of the time source may depend on the characteristics of the oscillator used. For example, a temperature compensated crystal oscillator (TCXO) may have a draft rate in the parts-per-million range while oven controlled crystal oscillators and cesium based oscillators may have a drift rate in the parts-per-billion. Thus, the threshold for the more accurate oscillator may be higher. If the variation in the oscillation count exceeds the threshold, the time quality module may indicate a failure of the first time source.

In another embodiment, the oscillator may be used to validate time quality measurements transmitted as part of the time source. For example, an IRIG signal includes a Time Quality and Continuous Time Quality indication. The time quality module may use the oscillator to validate the time quality signal received as part of the time source.

If, at 508, the time quality module determines that the first time source has not failed, the time quality module distributes time from the first time signal as the precision time reference at 510. If, at 508, the time quality module determines that the first time source has failed, at 512 the time quality module alerts a user that the best available time source has failed and that the time may not be accurate. In addition to alerting a user of the failure, the time quality module at 514 can determine a best available time source and at 516 distribute the best available time source as the precision time reference. The process for determining the best available time source is described in more detail below with reference to FIG. 7.

Figure 6:
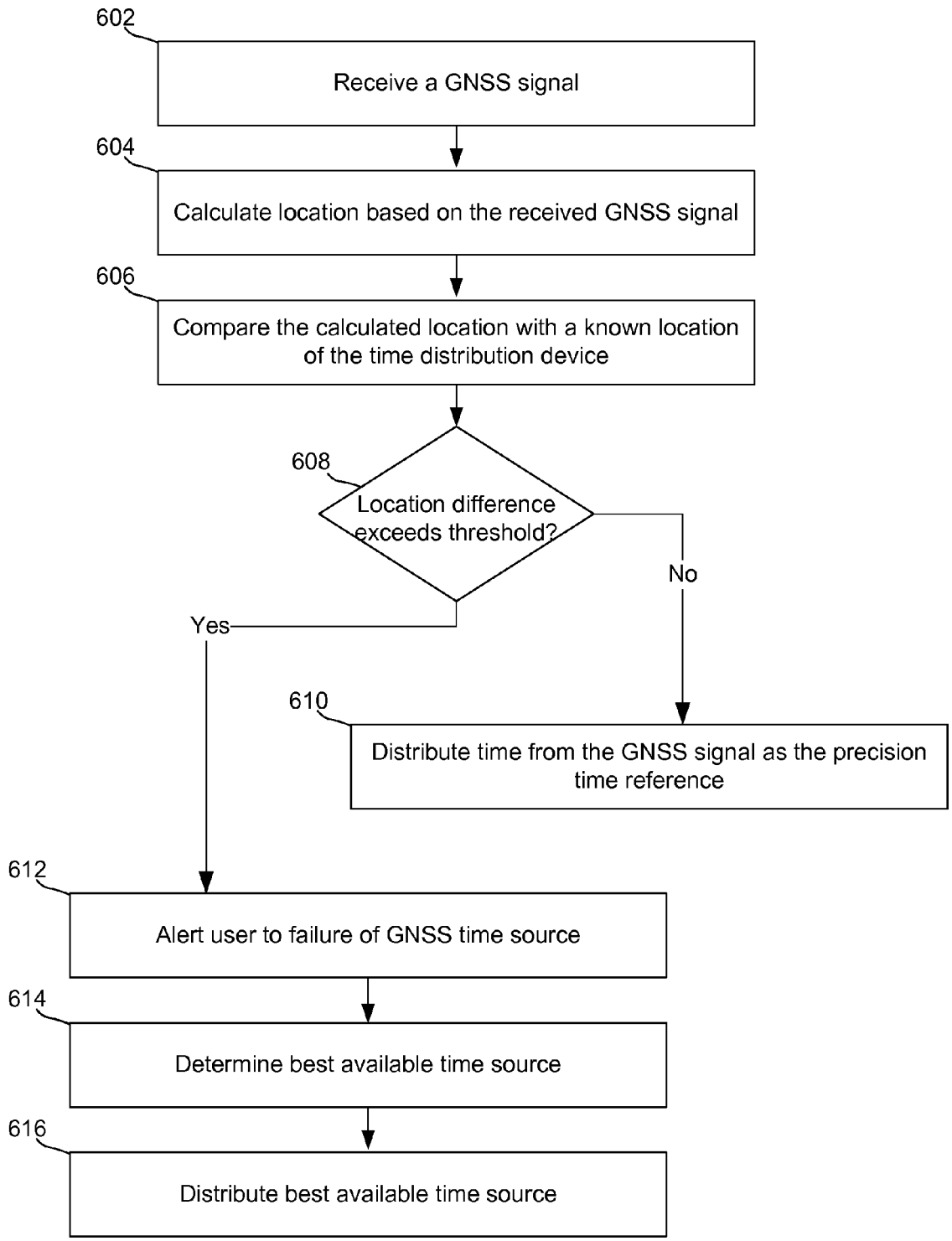
FIG. 6 illustrates one embodiment for determining whether a primary or best available time source has failed based on GNSS location.

The example embodiments above provide for a robust system of providing a precision time reference to time dependent devices by comparing several time signals to determine whether the best available time source has failed. FIG. 6 illustrates one embodiment for determining whether a primary or best available time source has failed based on GNSS location. In embodiments where GNSS is the best available time source, the location derived from the GNSS signal can be used a check for failure of the GNSS time source. This method is particularly useful in embodiments where the time distribution device is at a known, fixed location. In one embodiment, the known location of the time distribution device can be entered by a user at the time of setup and can be modified as necessary. In another embodiment, the known location of the time distribution device can be calculated using GNSS signals.

At 602 the time distribution device receives the GNSS signal. While the example of FIG. 6 is described in terms of a single GNSS signal for clarity, one of ordinary skill in the art will recognize that multiple signals from various GNSS satellites are typically used in determining GNSS receiver location and can be used to more accurately calculate GNSS receiver location. At 604, the GNSS receiver calculates the location of the time distribution device based on the received GNSS signal. The time quality module, at 606, compares the calculated location of the time distribution device with the known location of the time distribution device and determines whether the calculated location falls within a threshold distance from the known location. Because GNSS location calculation varies based on the techniques employed by the GNSS receiver, the threshold distance can vary from device to device.

If, at 608, the time quality module determines that the GNSS location falls within the threshold, the time quality module distributes the GNSS time as the precision time reference at 610. If, at 608, the time quality module determines that the GNSS location falls outside of the threshold and therefore the GNSS time source has failed, at 612 the time quality module alerts a user that the best available time source has failed and that the time may not be accurate. In addition to alerting a user of the failure, the time quality module at 614 can determine a best available time source and at 616 distribute the best available time source as the precision time reference. The process for determining the best available time source is described in more detail below with reference to FIG. 7.

In another embodiment, the time quality module may calculate a location drift rate using the GNSS signal and compare the location drift rate to a defined threshold. If the location drift rate exceeds the defined threshold, the time quality module may determine, at 608, that the GNSS time source has failed.

In one embodiment, the time quality module monitors instantaneous and average GNSS signal strength. If the instantaneous signal strength is larger than a set threshold for a set number of samples, then the time quality module may determine that the GNSS time source has failed. In such an instance, the time quality module may alert a user and/or rely upon a secondary time signal.

In another embodiment, satellite constellation may be monitored. Satellite constellation repeats every 24 hours. The time quality module may determine that the GNSS time source has failed by detecting a change in satellite constellation. In such an instance, the time quality module may alert a user and/or rely on a secondary time signal.

Figure 7:
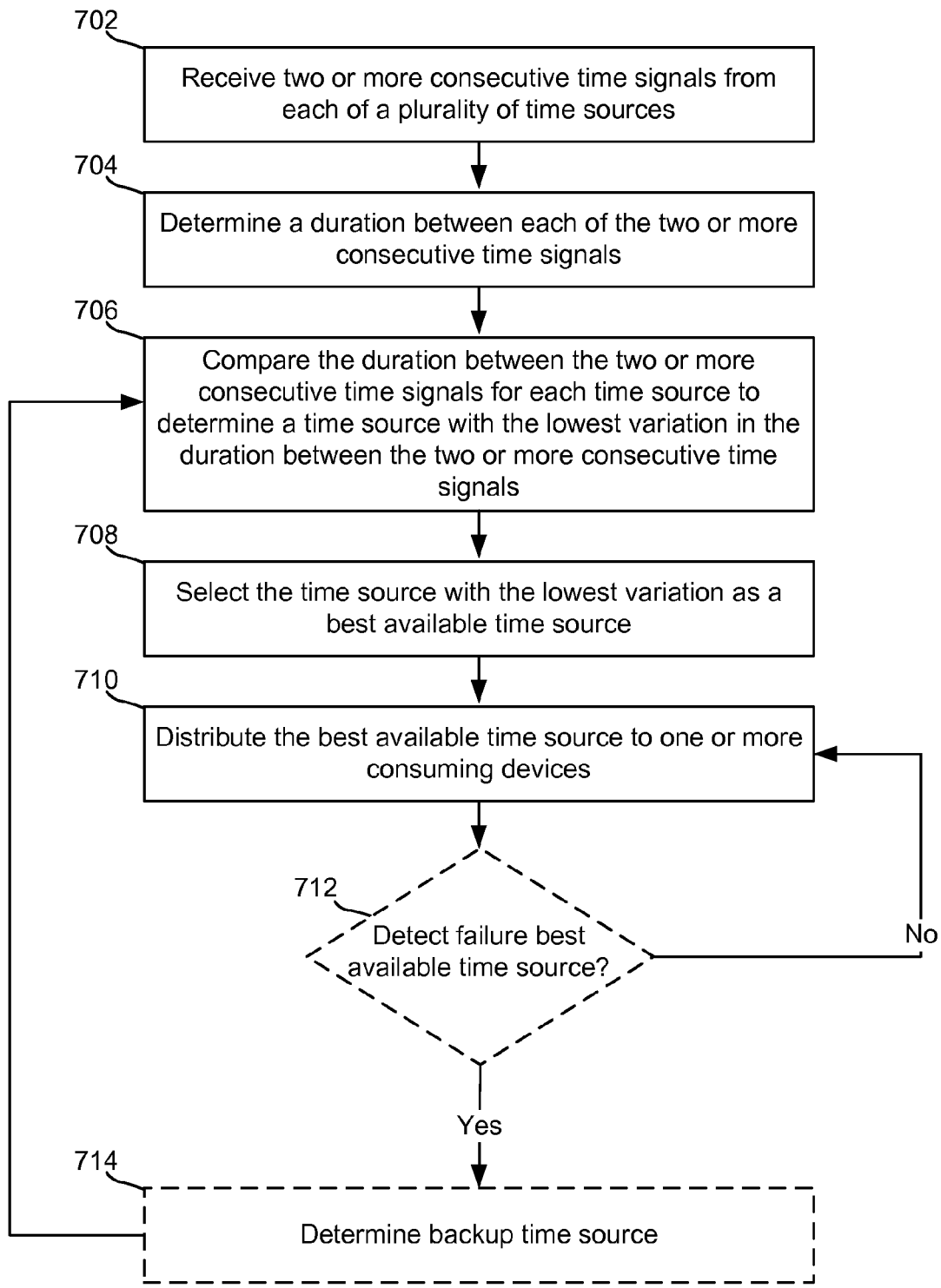
FIG. 7 illustrates one embodiment for determining a best available time source.

FIG. 7 illustrates one embodiment for determining/calculating the best available time source. At 702, the time distribution device receives two or more consecutive time signals from each of a plurality of time sources. In various embodiments, the times sources may include those described above. In one embodiment, a time signal may be, for example, a pulse-per-second (PPS) signal.

At 704, a time quality module of the time distribution device, may determine a duration between each of the two or more consecutive time signals for each of the plurality of time sources. In one embodiment, the duration between the two or more consecutive time signals is determined based on cycles of an internal oscillator. In various embodiments, the internal oscillator may be a high accuracy oscillator such as an oven controlled crystal oscillator (OCXO), a temperature compensated crystal oscillator (TCXO), a voltage controlled crystal oscillator (VCXO), a rubidium oscillator, an atomic oscillator, or the like.

At 706, the time quality module may compare the duration between the two or more consecutive time signals for each time source to determine a time source with the lowest variation in the duration between two or more consecutive time signals. For example, a first time source and a second time source provide a PPS to the time distribution device. The time quality module calculates a duration between consecutive PPS pulses for each of the first and second time source. The time quality module may then determine a variation of the duration between consecutive PPS pulses.

At 708, the time quality module may select the time source with the lowest variation in duration between consecutive time signals as the best available time source and at 710 distribute a time signal based on the best available time source to one or more consuming devices (e.g., an IED).

At 712, the time quality module may monitor the best available time source to determine a failure of the best available time source. The time quality module may determine the failure through methods such as those described above with reference to FIGS. 4-6.

At 714, if the time quality module determines that the best available time source has failed, the time quality module may determine a backup time source by returning to 706 to determine the best available time source. In some embodiments, when the time quality module determines a backup time source, the original best available time source is again included in the process at 706 and in some embodiments, the original best available time source may be excluded.

Figure 8:
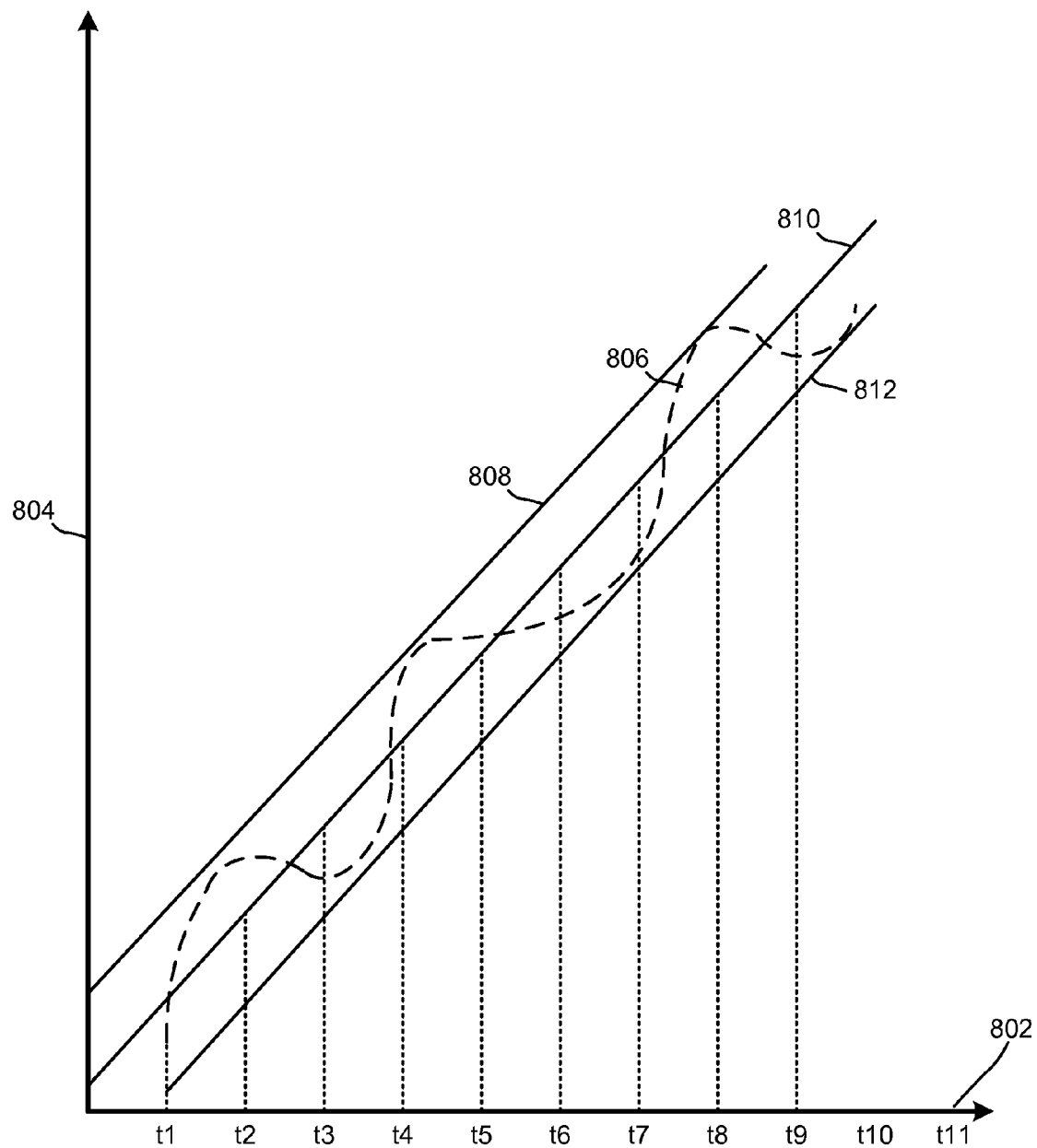
FIG. 8 illustrates an example diagram depicting the variation of the duration between consecutive time signals.

FIG. 8 illustrates an example diagram depicting the variation of the duration between two or more consecutive time signals for a particular time source. The example of FIG. 8 shows a time axis 802 and a free running count axis 802. The free running count may be provided by an internal oscillator as described above. The free running count over the period from t0 to t9 is depicted by broken line 806. The example also includes a maximum variation 808 and a minimum variation 812 from the average free running count 810.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A method comprising:
   receiving, at a time distribution device, two or more consecutive time signals from a first external time source;
   determining a first duration between each of the two or more consecutive time signals from the first external time source, wherein the first duration is based on an internal oscillator;

receiving, at the time distribution device, two or more consecutive time signals from a second external time source;

determining a second duration between each of the two or more consecutive time signals from the second external time source, wherein the second duration is based on the internal oscillator;

comparing the first duration and the second duration to determine a time source with the lowest variation in the duration between the two or more consecutive time signals;

selecting the time source with the lowest variation as a best available time source; and distributing the best available time source to one or more consuming devices.

2. The method of claim 1, wherein the internal oscillator comprises a high accuracy oscillator.

3. The method of claim 2, wherein the high accuracy oscillator comprises one of: an oven controlled crystal oscillator (OCXO); a temperature compensated crystal oscillator (TCXO); a voltage controlled crystal oscillator (VCXO); a rubidium oscillator; or an atomic oscillator.

4. The method of claim 1, wherein the first and second time sources include one or more of: Inter-Range Instrumentation Group (IRIG) protocol, a global navigation satellite system (GNSS), a National Institute of Science and Technology (NIST) broadcast, an Institute of Electrical and Electronics Engineers (IEEE) 1588 protocol, a network time protocol (NTP), a simple network time protocol (SNTP), or a precision time protocol.

5. A time distribution device comprising:

a plurality of receivers configured to receive consecutive time signals from each of first and second external corresponding precision time sources;

an output configured to provide a precision time signal to an intelligent electronic device (IED), wherein the precision time signal is determined from a best available time source of the first and second external corresponding precision time sources; and a time quality module configured to:
    determine, for the first external precision time source, a first duration between two or more consecutive time signals of the first external precision time source, wherein the first duration is based on an internal oscillator;
    determine, for the second external precision time source, a second duration between two or more consecutive time signals of the second external precision time source, wherein the second duration is based on the internal oscillator;
    compare the duration between the two or more consecutive time signals for each time source to determine a time source with the lowest variation in the duration between the two or more consecutive time signals; and
    select the precision time source with the lowest variation as the best available time source.

6. The time distribution device of claim 5, wherein the internal oscillator comprises a high accuracy oscillator.

7. The time distribution device of claim 6, wherein the high accuracy oscillator comprises one of: an oven controlled crystal oscillator (OCXO); a temperature compensated crystal oscillator (TCXO); a voltage controlled crystal oscillator (VCXO); a rubidium oscillator; or an atomic oscillator.

8. The time distribution device of claim 5, wherein the first and second precision time sources include one or more of: Inter-Range Instrumentation Group (IRIG) protocol, a global navigation satellite system (GNSS), a National Institute of Science and Technology (NIST) broadcast, an Institute of Electrical and Electronics Engineers (IEEE) 1588 protocol, a network time protocol (NTP), a simple network time protocol (SNTP), or a precision time protocol.

9. The time distribution device of claim 5, wherein the time quality module is further configured to:
    detect a failure of the selected precision time source; and
    determine a backup precision time source for use as the best available time source, wherein the process to determine the best available time source is repeated to determine the backup time source.

10. The time distribution device of claim 9, wherein to detect a failure of the selected precision time source the time quality module is configured to:
    train an unlocked oscillator with a time signal from the best available time source;
    compare the time signal from the best available time source to a drift rate of the unlocked oscillator; and
    detect a failure of the best available time source in response to the comparing showing that the time signal from the best available time source varies from the drift rate of the unlocked oscillator by a defined margin.

11. The time distribution device of claim 9, wherein the time quality module is further configured to indicate a failure condition in response to detecting a failure of the best available time source.

12. The time distribution device of claim 9, wherein to detect a failure of the selected precision time source the time quality module is configured to:
    receive a location based on a plurality of Global Navigational Satellite System (GNSS) signals received at the time distribution device;
    compare the received location with a known location of the time distribution device; and
    detect a failure of the best available time source in response to the received location and the known location differing by a defined margin.

13. The time distribution device of claim 12, wherein the known location is calculated using the plurality of GNSS signals.

14. The time distribution device of claim 12, wherein the known location is entered into the time distribution device at setup.

15. A non-transitory computer readable storage medium having instructions stored thereon, which when executed by a processor, cause the processor to perform a method for determining a best available time source, the method comprising:

receiving, at a time distribution device, two or more consecutive time signals from a first external time source;

determining, for the first external time source, a first duration between each of the two or more consecutive time signals, wherein the first duration is based on an internal oscillator;

receiving, at the time distribution device, two or more consecutive time signals from a second external time source;

determining, for the second external time source, a second duration between each of the two or more consecutive time signals, wherein the second duration is based on the internal oscillator;

comparing the first duration and the second duration for each time source to determine a time source with the lowest variation in the duration between the two or more consecutive time signals; and selecting the time source with the lowest variation as the best available time source.

16. The non-transitory computer readable storage medium of claim 15, wherein the internal oscillator comprises a high accuracy oscillator.

17. The non-transitory computer readable storage medium of claim 16, wherein the high accuracy oscillator comprises one of: an oven controlled crystal oscillator (OCXO); a temperature compensated crystal oscillator (TCXO); a voltage controlled crystal oscillator (VCXO); a rubidium oscillator; or an atomic oscillator.

18. The non-transitory computer readable storage medium of claim 15, wherein the first and second precision time sources include one or more of: Inter-Range Instrumentation Group (IRIG) protocol, a global navigation satellite system (GNSS), a National Institute of Science and Technology (NIST) broadcast, an Institute of Electrical and Electronics Engineers (IEEE) 1588 protocol, a network time protocol (NTP), a simple network time protocol (SNTP), or a precision time protocol.

19. The non-transitory computer readable storage medium of claim 15, wherein the method further comprises distributing the best available time source to one or more consuming devices.

20. The non-transitory computer readable storage medium of claim 15, wherein the method further comprises:
    detecting a failure of the selected time source; and
    determining a backup time source for use as the best available time source, wherein the method for determining the best available time source is repeated to determine the backup time source.

* * * * *